United States Patent [19]

Sutrina

[11] Patent Number: 4,614,964
[45] Date of Patent: Sep. 30, 1986

[54] COAXIAL SEMICONDUCTOR PACKAGE

[75] Inventor: Thomas Sutrina, Rockford, Ill.

[73] Assignee: Sundstrand Corporation, Rockford, Ill.

[21] Appl. No.: 641,215

[22] Filed: Aug. 15, 1984

[51] Int. Cl.$^4$ .................. H01L 23/46; H01L 29/52
[52] U.S. Cl. ......................... 357/76; 357/81; 357/82; 357/79; 174/15 R; 361/385; 361/388
[58] Field of Search ............ 165/109 R, DIG. 11, 165/80 C; 174/15 R; 357/76, 77, 79, 75, 82; 361/385, 388

[56] References Cited

U.S. PATENT DOCUMENTS

| | | | |
|---|---|---|---|
| 3,025,436 | 3/1962 | Staller | 165/80 C |
| 3,146,362 | 8/1964 | Bates et al. | 357/76 |
| 3,366,171 | 1/1968 | Scharli | 361/388 |
| 3,474,302 | 10/1969 | Blundell | 357/79 |
| 3,474,306 | 10/1969 | Vogt | 357/79 |
| 3,474,358 | 10/1969 | Geddry et al. | 357/76 |
| 3,566,958 | 3/1971 | Zelina | 357/79 |
| 3,784,885 | 1/1974 | Weidemann | 357/79 |
| 3,831,062 | 8/1974 | Haug et al. | 357/76 |
| 4,128,870 | 12/1978 | Knobloch et al. | 357/79 |
| 4,224,663 | 9/1980 | Maiese et al. | 357/79 |
| 4,273,185 | 6/1981 | Thoma et al. | 165/80 B |
| 4,313,128 | 1/1982 | Schlegel | 357/79 |
| 4,390,891 | 6/1983 | Bahlinger | 357/79 |
| 4,403,242 | 9/1983 | Tsuruoka | 357/39 |
| 4,528,615 | 7/1985 | Perry | 361/386 |

FOREIGN PATENT DOCUMENTS 2135119  8/1984  United Kingdom ............... 357/79

Primary Examiner—James W. Davie
Assistant Examiner—Vangelis Economou
Attorney, Agent, or Firm—Wood, Dalton, Phillips, Mason & Rowe

[57] ABSTRACT

A semiconductor package including a first electrically conductive bus and a second electrically conductive bus spaced from and generally surrounding the first bus in approximately concentric relation thereto. A plurality of generally equally angularly spaced semiconductors are located in the space between the buses and each semiconductor has at least two electrodes. One electrode of each semiconductor is connected to the first bus and the other electrode is connected to the second bus.

14 Claims, 3 Drawing Figures

COAXIAL SEMICONDUCTOR PACKAGE

FIELD OF THE INVENTION

This invention relates to a semiconductor package, and more particularly, to a coaxial semiconductor package which may be utilized as a switch in high power systems.

BACKGROUND OF THE INVENTION

Prior art of possible relevance includes U.S. Pat. Nos. 3,366,171 issued Jan. 30, 1978 to Scharli and 3,474,358 issued Oct. 21, 1969 to Geddry et al.

Current, voltage and frequency limitations of switch arrays formed of plural semiconductors are determined by the assembly's ability to maintain the operation of each individual semiconductor within its operating envelope. For example, where plural semiconductors are arranged in electrical parallel to operate as a switch, under high power loading if the semiconductors are not turned on or off simultaneously, one or more of the semiconductors in the assembly may be overloaded momentarily with the consequence that it may be damaged or fail.

Another difficulty that may be encountered is stored energy in the system. When the semiconductors are turned off, such stored energy may be converted into a ringing signal which is damped oscillating high voltage spike. Ultimately, the ringing signal converts to heat which can limit switch capacity.

The present invention is directed to overcoming one or more of the above problems.

SUMMARY OF THE INVENTION

It is a principal object of the invention to provide a new and improved semiconductor package. More specifically, it is an object of the invention to provide a semiconductor package wherein the geometry is such that several semiconductors comprising the package are controlled simultaneously to avoid momentary overloading of one or more of the semiconductors in the package. It is also an object of the invention to provide an assembly wherein stored energy which could result in ringing and the problems associated therewith is minimized.

An exemplary embodiment of the invention achieves the foregoing object in a semiconductor package comprising a first electrically conducting bus, a second electrically conducting bus spaced from and generally surrounding the first bus in approximately concentric relation thereto, and a plurality of generally equally angularly spaced semiconductors in the space between the buses. Each of the semiconductors has at least first and second electrodes and the first electrodes of the semiconductors are connected to the first bus while the second electrodes of the semiconductors are connected to the second bus.

According to the invention, such a construction results in an extremely compact structure which in turn minimizes stored energy which could result in ringing. At the same time, the concentric arrangement of the semiconductors assures that control signals for controlling the conductive states of the semiconductors will travel equal distances so that all semiconductors are controlled simultaneously to avoid the problems associated with systems wherein one or more semiconductors alter their conductive state slightly before or slightly after other semiconductors in the circuit.

The preferred embodiment of the invention contemplates that one set of the electrodes be in essentially direct contact with the associated bus and that the package further include pressurizing means for pressing such electrodes against the associated bus. A force equalizing system may be provided wherein an approximately equal pressing force is exerted against each of the semiconductors.

In a highly preferred embodiment of the invention, the semiconductors have at least three electrodes, one of which is a control electrode. The bus associated with the control electrode is a control bus and is adapted to receive a control signal for controlling the conduction of the semiconductors.

Preferably, the control bus is a central conductor.

The invention also contemplates the provision of coolant passages in the second bus in heat exchange relation with the semiconductors.

The semiconductors are unpackaged as such and are in wafer form.

Other objects and advantages will become apparent from the following specification taken in connection with the accompanying drawings.

DESCRIPTION OF THE PREFERRED EMBODIMENTS

Figure 1:
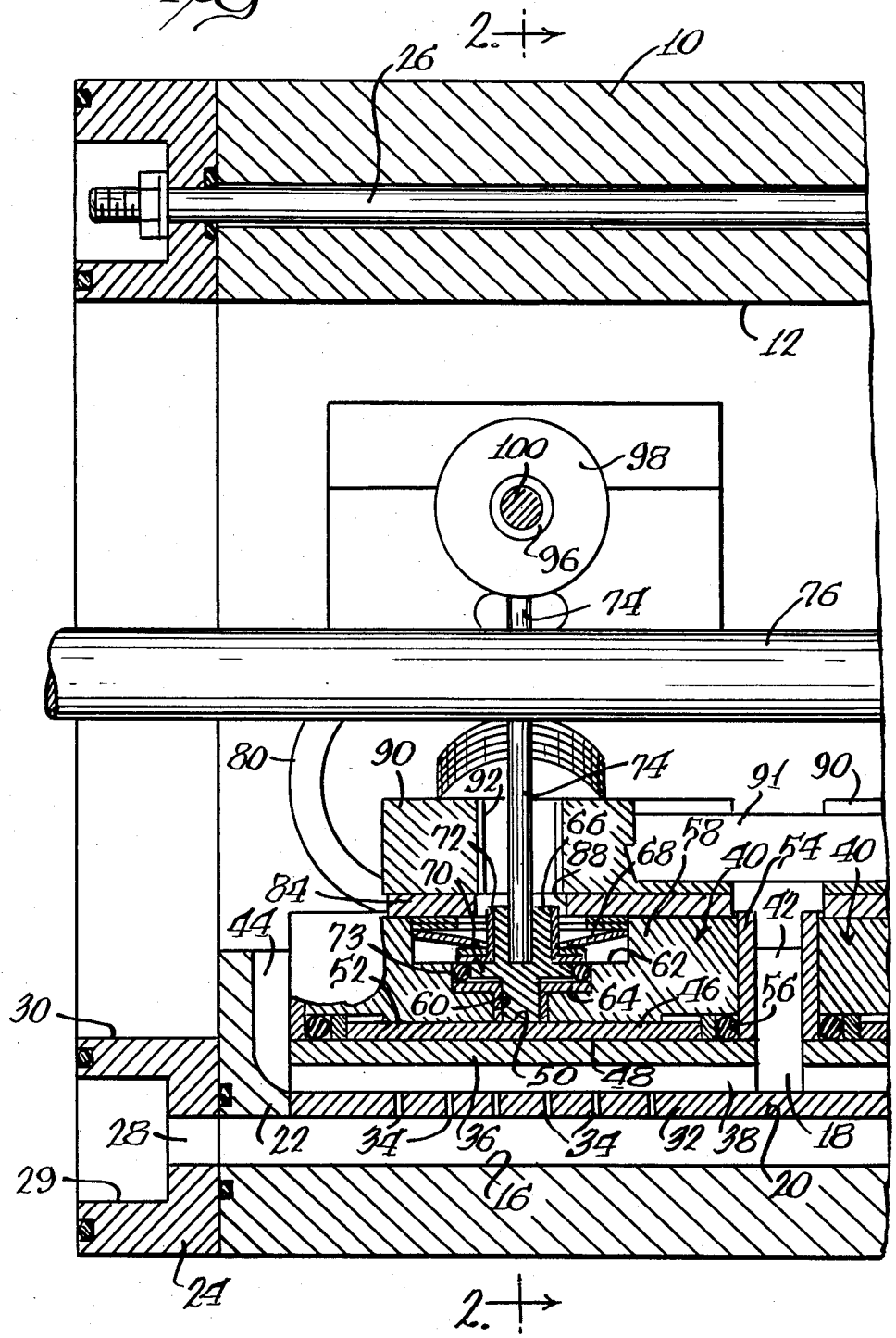
FIG. 1 is a sectional view of one form of a semiconductor package or assembly made according to the invention and taken approximately along the line 1—1 in FIG. 2.
Figure 2:
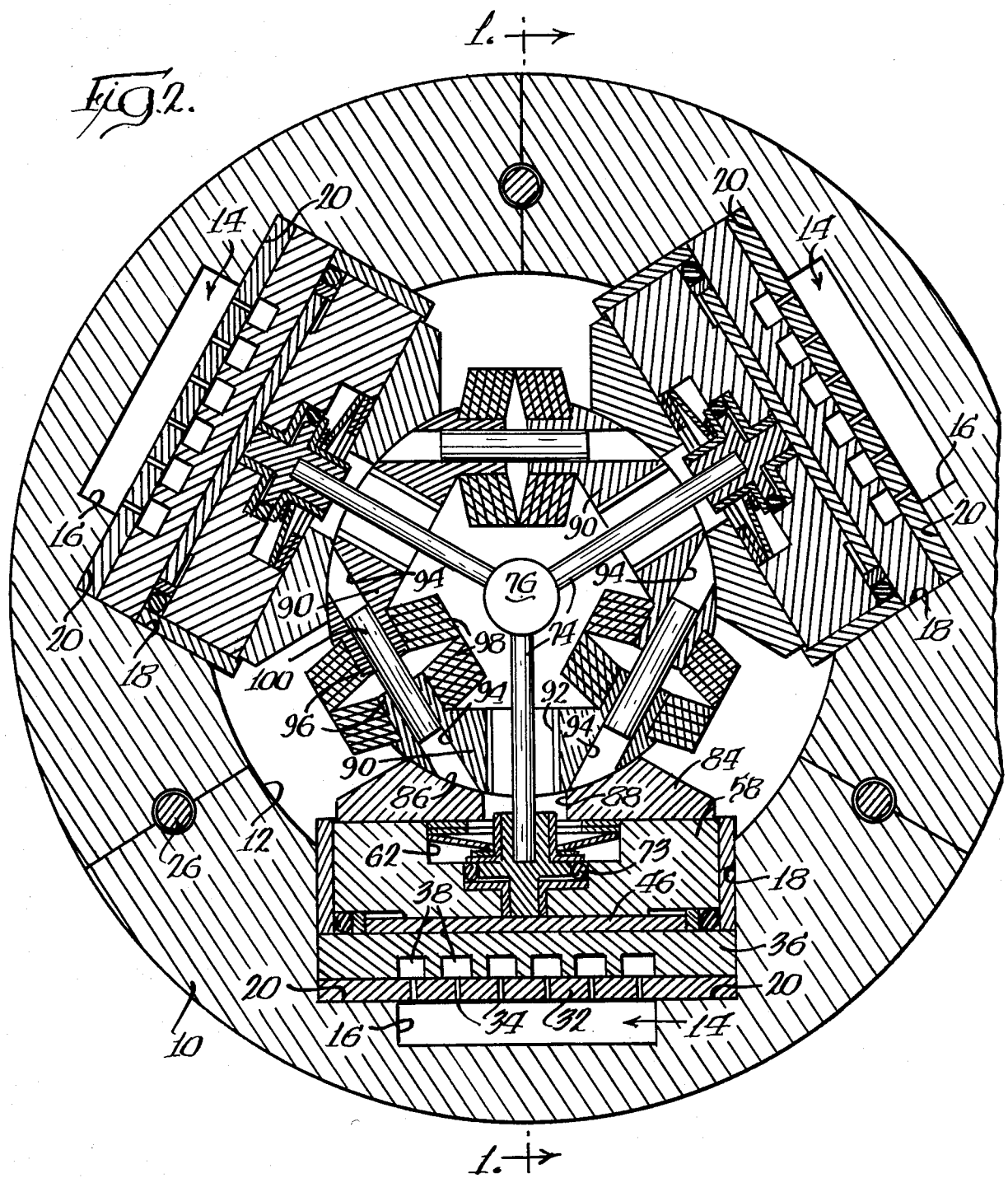
FIG. 2 is a sectional view taken approximately along the line 2—2 in FIG. 1.

A first exemplary embodiment of a semiconductor package made according to the invention is illustrated in FIGS. 1 and 2 and is seen to include a cylindrical tubular housing 10 formed of electrically conductive material and having a radially inner wall 12. For ease of assembly, the housing 10 may be formed of plural segments suitably secured together. As seen in FIG. 2, at equally angularly spaced locations, the wall 12 is provided with recesses, generally designated 14. Each of the recesses 14 has a radially outer narrow portion 16 and a radially inner, wider portion 18. As seen in FIG. 1, the narrow portion 16 extends axially along the length of the tube 10 while the wider portion 18, which is separated from the narrower portion by a shoulder 20, stops short of the ends of the tubular housing 10 as illustrated at 22.

An end cap 24 of any desired configuration is secured as by tie bolts 26 to the ends of the tubular housing 10. Where plural ones of the housings 10 are used, and the semiconductors associated with one housing 10 are operated at different voltages from the semiconductors associated with another housing the tie bolts 26 and other fastening hardware may be coated with insulating material to provide the requisite electrical isolation and the end caps 24 separating such housings 10 formed of insulating material. The end caps 24 are each provided with a series of ports 28 corresponding to the number of recesses 14 and in fluid communication with the narrow portions 16 thereof. The ports 28 emerge from each end cap 24 in an enlarged annulus 29. The center of the end cap 24 is open as at 30. The ports 28 serve as an inlet for a coolant as will be seen while the open center 30 of the end caps may serve as an outlet for such coolant. Alternately, the ports 28 on opposite ends of the assembly may respectively serve as inlets and outlets.

Abutting the shoulder 20 in each of the recesses 14 is a circular, electrically conductive plate 32 provided with a series of perforations 34. The plate 32 is in turn abutted by a channeled electrically conductive plate 36 having channels 38 aligned with and facing the perforations 34. The plates 32 may be indexed as by pins (not shown) to assure such alignment to prevent the perforation 34 from being closed by the material of the plates 36 separating the channels 38. The plates 32 and 36 define a heat exchanger with liquid coolant introduced into the narrow portion 16 of the grooves 14 passing through the perforations 34 to impinge against the plate 36 in the channels thereof. To assure good heat transfer, the plate 36 is not only electrically conductive, but highly thermally conductive as well.

Abutting each of the plates 36 is a semiconductor assembly, generally designated 40. Several of the assemblies may be located axially along the length of the tubular housing 10 and in the embodiment illustrated, three are located radially of each other in the housing 10 at each of several locations along the length of the housing 10.

The spacing between adjacent assemblies 40 is shown at 42 and it will be seen that the ends of the channels 38 enter into such a space as well as into a passage 44 adjacent one end of the tubular housing 10. As a consequence, the coolant may flow radially inwardly of the assemblies 40 after emerging from the ends of the channels 38.

Each semiconductor assembly 40 includes a semiconductor wafer 46. The wafer may be a conventional semiconductor except that the same is not provided with the usual packaging by the manufacturer. The same will have at least two electrodes and typically three, one electrode 48 of which will be in good thermal and electrical contact with the plate 36. Because the plate 36 and the plate 32 are electrically conductive, the same serve to connect the electrode 48 to the housing 10 which serves as a bus in the system.

Where the semiconductor 46 is not a diode, the opposite side of the semiconductor 46 has two electrodes. One is shown at 50 and is centrally located. Typically, the electrode 50 will be a control electrode on which is placed a signal which controls the conductive state of the wafer 46.

The last electrode is shown at 52 and is disposed about the electrode 50. Those skilled in the art will immediately recognize that the main power path through the semiconductor wafer 46 is between the electrodes 48 and 52.

Surrounding each wafer 46 is an electrically insulating sleeve 54 and a sealing O-ring 56 for the purpose of preventing liquid coolant from gaining access to the semiconductor 46. Within the sleeve 54 is an electrically conducting pressure shoe 58 which compresses the O-ring seal 56 against the plate 36 to achieve the desired sealing. Where the semiconductor 46 is not a diode, the shoe 58 includes a central bore 60 terminating in a stepped recess 62. The bore 60 and part of the recess 62 are lined with insulating material as shown at 64 and an electrical conductor 66 having the configuration illustrated is disposed therein. The electrical conductor 66 makes electrical contact with the electrode 50. Within the recess 62, a Belleville washer 68 is disposed to bear against a shoulder 70 on the conductor 66 via insulating material 72 to bias the conductor 66 into good electrical contact with the electrode 50.

The structure employs a compressed O-ring seal 73 in a step of the stepped recess 62 in each shoe 58 to prevent the flow of coolant to the side of the wafer 46 having the electrodes 50 and 52.

A plurality of stranded wire conductors 74 are joined to each of the conductors 76 and extend radially inwardly to a central conductor 76 to be connected thereto by any suitable means. The central conductor 76 is generally concentric with the tubular housing 10 and serves as a bus, and specifically as a control bus, for receiving a control signal that is placed upon the control electrodes 50 via the conductors 74 and 66. Where the semiconductors 46 are diodes, the central conductor 76 may be omitted.

The shoes 58 are in turn abutted by somewhat frustoconical pressure blocks 84. The pressure blocks 84 have an upper concave cylindrical surface 86 as best seen in FIG. 2 and a central opening 88 through which the conductors 74 pass. The cylindrical surfaces 86 are in turn abutted by cylindrical segments 90 which are also provided with central openings 92 to permit passage of the conductors 74. The openings 88 and 92 are considerably larger than are the conductors 74 to assure electrical isolation and if desired, can be lined with insulating material.

The blocks 84 are electrically and thermally conductive and are in electrical contact with the electrodes 52 of the associated wafers 46 via the shoes 58. Flexible conductors 80 may be suitably attached to the various ones of the blocks 84.

The cylindrical segments 90 serve as a main or power bus. Where a series of semiconductors extends axially of the assembly, for alignment purposes and/or to accommodate semiconductors of differing thickness along the length of the series, each semiconductor 46 has an associated segment 90. Segments 90 requiring interconnection may be provided with stranded wire connections 91.

The cylindrical segments 90 are each provided with internal bores 94 that are alignable with identical bores 94 in the adjacent cylindrical segments 90. The ends of the bores 94 are surrounded by concentric bosses 96 and a series of Belleville washers 98 are disposed on each of the bosses 96 while an alignment pin 100 extends between the bosses 96 in the bores 94 of adjacent segments 90. As a consequence of this construction, it will be appreciated that spring forces provided by the Belleville washers 98 will ultimately be communicated to the shoes 58 to urge the electrodes 48 into good electrical contact with the housing 10 via the heat exchanger defined by the plates 32 and 36. It will further be appreciated that the use of cylindrical surfaces makes the cylindrical segments 90 self centering and promotes equalization of the forces around the main bus defined by the segments 90 so that each of the wafers 46 is subjected to substantially equal pressure.

Figure 3:
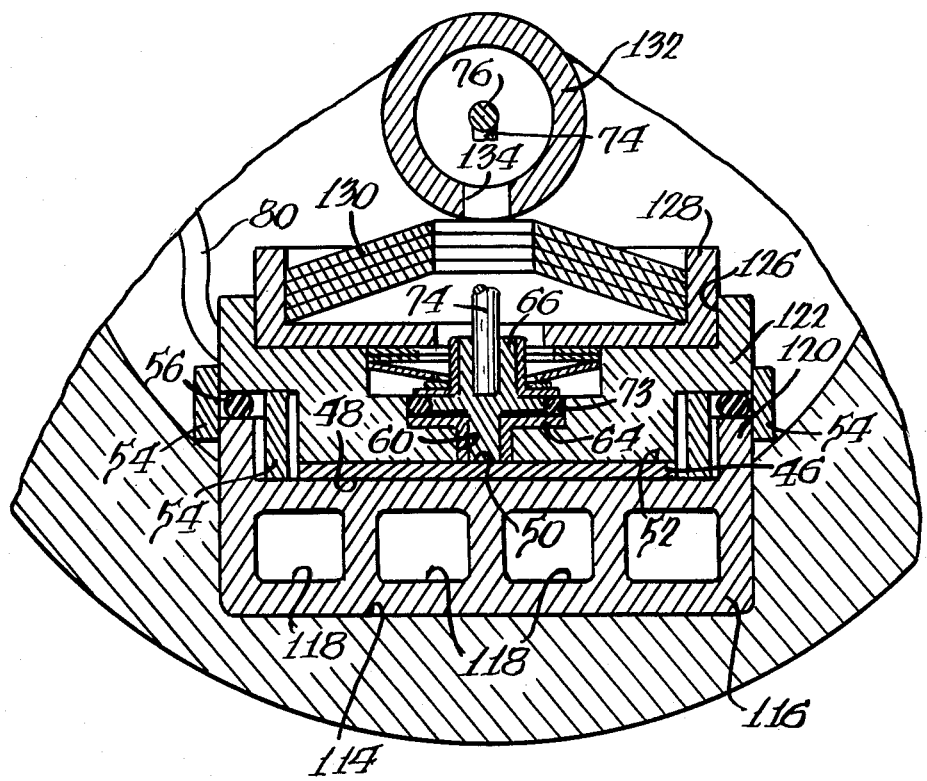
FIG. 3 is a fragmentary sectional view similar to FIG. 1 but illustrating a modified embodiment of the invention.

A modified embodiment of the invention is illustrated in FIG. 3 and in the interest of brevity, like components are given like reference numerals. In this embodiment, the recess 14, shown at 114 is not stepped and in lieu of the heat exchanging plates 32 and 36, a unitary structure in the form of an insert 116 having parallel axial coolant passages 118 is utilized. Alternatively, the insert 116 may be omitted entirely and the passages 118 formed directly in the housing 10. The insert 116 may include a series of cup-shaped radially inwardly directed walls 120 which receive the semiconductor wafers 46. A modified form of a pressure shoe is shown at 122 and an O-ring seal 56 is interposed between the same and the wall 120 for sealing purposes. Insulators 54 flank the seal 56.

The shoe 122, at its radially inner extent, includes a recess 126 receiving a cup-shaped spacer 128 which may be formed of insulating material. A series of Belleville washers 130 are interposed between a central tube 132, which houses the central conductor 76, and the spacer 128 to provide the desired biasing force against the semiconductor wafer 46.

In this embodiment, the central tube 132 is provided with openings 134 at desired locations along its length through which the conductors 74 may extend. If the spacer 128 is formed of insulating material, the tube 132 may act as the control bus 76 and the shoe 122 as a main power bus along with the housing 10.

From the foregoing, it will be appreciated that a semiconductor package made according to the invention provides a number of advantages over structures heretofore known. The concentric or coaxial nature of the same makes it extremely compact thus minimizing system capability for storing energy. It will also be observed that when the central conductor 76 is utilized as a control bus, because it is centrally located and connected to the control electrodes 50 of the semiconductors by radially extending conductors 74 of equal length, the control signal will be simultaneously applied to the control electrodes 50 of all of the semiconductors in the array. Consequently, the possibility that one semiconductor will begin to conduct shortly before or shortly after another, due to differences in control lead length, and the resulting damage that may occur when high power levels are present, is avoided.

Such heat as generated in the system is easily dissipated through the use of the heat exchanger structures illustrated without sacrificing compactness.

I claim:

1. A semiconductor package comprising:
   a first, electrically conducting bus;
   a second, electrically conducting bus spaced from and generally surrounding said first bus in approximate concentric relation thereto and being electrically isolated therefrom; and
   a plurality of generally equally angularly spaced semi-conductors in the space between said buses, each said semiconductor having at least first and second electrodes;
   said first electrodes being electrically connected to said first bus and said second electrodes being electrically connected to said second bus.

2. The semiconductor package of claim 1 wherein one of said first and second electrodes are in essentially direct contact with the associated bus, and further including pressurizing means for pressing said one of said first and second electrodes against the associated bus.

3. The semiconductor package of claim 2 wherein said pressurizing means supply an approximately equal pressing force against each of said semiconductors.

4. The semiconductor package of claim 1 wherein said semiconductors have at least three electrodes, including control electrodes, and a third bus within and generally concentric to at least said second bus, said third bus being a control bus adapted to receive a control signal for controlling the conduction of said semiconductors and being electrically connected to said control electrodes.

5. The semiconductor package of claim 4 wherein said control bus is within and concentric to both said first and second buses.

6. The semiconductor package of claim 1 wherein said second bus includes coolant passages in heat exchange relation with said semiconductors.

7. A semiconductor package comprising:
   a circular tube-like housing formed of electrically conducting material and having a radially inner wall;
   a plurality of generally equally angularly spaced recesses in said wall;
   a semiconductor wafer having at least three electrodes, including a control electrode, in each of said recesses and having two electrodes including said control electrode, electrically isolated from said housing and the third electrode connected to said housing;
   means within said housing for biasing said wafers into their respective recesses;
   a central conductor within said housing in generally concentric relation thereto and electrically isolated therefrom; and
   electrically conductive means of approximately equal length extending from said central conductor to respective ones of said control electrodes and electrically isolated from said housing;
   said biasing means including additional electrically conductive means in contact with the remaining electrode of each semiconductors and electrically isolated from said housing, said central conductor, and said extending means.

8. The semiconductor package of claim 7 wherein heat exchangers are disposed in the bottoms of each of said recesses and are abutted by the respective third electrode of the associated semiconductor wafer to cool the same, said heat exchangers establishing an electrical connection between said third electrodes and said housing.

9. The semiconductor package of claim 8 wherein said heat exchangers include an insert having an axial coolant passage.

10. The semiconductor package of claim 8 wherein each said recess is stepped, having a radially outer narrow portion separated from a radially inner wider portion by a shoulder, said narrow portion serving as a coolant manifold, said heat exchangers each comprising a perforated plate abutting said shoulder and a channeled plate having channels aligned with and facing the perforations in said perforated plate interposed between said perforate plate and said wafer.

11. The semiconductor package of claim 7 wherein said biasing means acts radially between said central conductor and said wafer.

12. The semiconductor package of claim 7 wherein said biasing means comprise sets of springs, each set acting against two adjacent wafers along a chord of the housing.

13. The semiconductor package of claim 12 wherein two of said sets act against each wafer.

14. The semiconductor package of claim 13 further including force equalizing means disposed between said sets and said wafers to assure that an approximately equal biasing force is applied to each of said wafers.

* * * * *